324-77 SR

7/10/84 OR 4,459,542

United States Patent [19]

Terrier et al.

[11] Patent Number: 4,459,542

[45] Date of Patent: Jul. 10, 1984

[54] SPECTRUM ANALYZER HAVING COMMON TWO-CHANNEL FILTERS, ESPECIALLY FOR VOICE RECOGNITION

[75] Inventors: Christian Terrier; Christian Caillon, both of Grenoble; Daniel Barbier, deceased, late of Echirolles, France, by Michéle Barbier, Administratrix

[73] Assignee: Societe pour l'Etude et la Fabrication de Circuits Integres Speciaux-EFCIS, Grenoble, France

[21] Appl. No.: 396,592

[22] Filed: Jul. 9, 1982

[30] Foreign Application Priority Data

Jul. 10, 1981 [FR] France ................................ 81 13674

[51] Int. Cl.[3] ................................................ G01R 23/16

[52] U.S. Cl. .................................... 324/77 E; 307/522; 328/167

[58] Field of Search .................. 324/77 E, 77 D, 78 F, 324/77 F; 307/522, 524; 328/105, 138, 153, 167

[56] References Cited

U.S. PATENT DOCUMENTS

| | | | |
|---|---|---|---|
| 3,519,926 | 7/1970 | Chandos | 324/77 E |
| 3,581,192 | 5/1971 | Miura | 324/77 E |
| 3,590,284 | 6/1971 | Yamaoe | 307/295 |
| 4,137,510 | 1/1979 | Iwahara | 333/6 |
| 4,157,457 | 6/1979 | Sakoe et al. | 179/1 SA |

*Primary Examiner*—Michael J. Tokar

*Attorney, Agent, or Firm*—Cushman, Darby & Cushman

[57] ABSTRACT

A spectrum analyzer comprises a plurality of filters each provided with a low-pass output and a high-pass output both having the same cutoff frequency which is different in the case of the different filters. Switching means are provided for periodically connecting pairs of filters in cascade during a first time interval between one input for signals to be analyzed and a filtered-signal transmission channel assigned to each pair of filters. One of the filters of each pair has a high-pass (or respectively low-pass) output connected to the input of the other filter whose utilization output is the low-pass (or respectively high-pass) output. The switching means also have the function of periodically establishing a cascade connection during a second time interval between pairs of filters which are different from the first pairs. In the case of one filter, the output utilized during the second time interval is different from the output utilized during the first time interval.

7 Claims, 8 Drawing Figures

SPECTRUM ANALYZER HAVING COMMON TWO-CHANNEL FILTERS, ESPECIALLY FOR VOICE RECOGNITION

This invention relates to a spectrum analyzer, that is, a filter circuit which is capable of receiving an electrical signal having a predetermined frequency spectrum, and consists in determining the energy contained in each one of a number of narrow frequency bands of said spectrum.

The electrical signal may be produced by a microphone into which the user speaks and the spectrum analyzer accordingly serves in that case to analyze or to recognize the voice sound emitted. The energy spectrum of certain phonemes emitted (and particularly vowel sounds and consonant sounds) is in fact characteristic of these phonemes.

In order to gain a clear understanding of this invention, FIG. 1 of the accompanying drawings provides a conventional diagram of a spectrum analyzer used for speech recognition.

In addition to the elements which are specifically employed for speech recognition and which consist respectively of a microphone 10, a preamplifier with gain control 12, a low-pass filter 14 having a cutoff frequency of 5 kHz, and a correction filter 16 which establishes a preaccentuation of the signal with a slope of +6 decibels per octave between 500 and 5000 Hz and unattenuated transmission below 500 Hz, the spectrum analyzer essentially comprises a series of filtering channels in parallel V1 to Vn, a multiplexing system 18 and an analog-to-digital converter 20. A control logic circuit 22 controls the operation of the filters of channels V1 to Vn of the multiplexing system and of the converter.

Each filtering channel Vi comprises a narrow-band-pass filter having two cutoff frequencies, for example. These filters have a high rejection outside the interval of their cutoff frequencies (40 dB/decade, for example) and may consist, for instance, of filters of the fourth order.

In order to resolve the frequency spectrum under analysis, steps can be taken to ensure that the filtering channels have narrow passbands in substantially adjacent relation or in other words that the top cutoff frequency of one filter is the same as the bottom cutoff frequency of the following filter.

The bottom and top cutoff frequencies of the filter FBi of channel Vi can be designated respectively as $f_{i-1}$ and $s_i$.

The filtering channels can be variable in number. For example, provision can be made for sixteen or thirty-two filtering channels with a logarithmic distribution of the passbands of each filter between 100 Hz and 5000 Hz (the bottom cutoff frequency $f_o$ of the first filter is approximately 100 Hz and the top cutoff frequency of the last filter FBn is approximately 5000 Hz).

Each filter is followed by a thresholdless rectifier (R1 to Rn) which is in turn followed by an averaging integrator (I1 to In) which can be a low-pass filter of the second order having a cutoff frequency of approximately 25 hertz in the case of the lower-frequency channels whereas this frequency can be of higher value in the case of the higher-frequency channels.

The multiplexing system receives the signals delivered by each channel or in other words receives signals which each represent the signal energy contained within a respective narrow frequency band. Under the action of the control logic unit 22, said multiplexing system performs cyclic sampling of a signal value at the output of each channel (with a period of approximately twenty milliseconds since it is estimated that the phonemes are renewed in a normal speech emission with a period of this order) and said signal value is transmitted by the multiplexing system to the analog-to-digital converter 20. In consequence, said converter receives during each period of twenty milliseconds a series of n signal samples each corresponding to the output of one filtering channel. These samples are converted to digital signals and the output of the spectrum analyzer therefore emits series of digital values which are coefficients representing the energy of the signal within each narrow band of the spectrum.

One of the difficulties arising from the construction of an analyzer of this type in the form of an integrated circuit lies in the large area of silicon which is required in order to accommodate all the circuit elements. In particular, and irrespective of the mode of construction adopted, the n narrow-passband filters take up an amount of space which is larger as the order of filters is higher and therefore as the filtering power is greater.

The present invention proposes a spectrum analyzer structure which differs to a slight extent from the structure of FIG. 1 in regard to the arrangement of the filtering channels and which permits replacement of n filters of a relatively high order (for example a fourth order) by n+1 filters of a lower order (for example the second order) without impairing the quality of filtering within each band.

In order to achieve this objective, it is first proposed to split-up each bandpass filter having two main cutoff frequencies into two more simple filters each having a main cutoff frequency and having two different outputs consisting respectively of a low-pass output which has said cutoff frequency and a high-pass output which has the same cutoff frequency. One of these filters of more simple type is then utilized in a first stage as a low-pass filter in cascade connection with another simple filter of the high-pass type having a lower cutoff frequency and then, in a second stage, as a high-pass filter in cascade connection with a simple low-pass filter having a higher cutoff frequency. In the first stage, one of the filter outputs is employed whereas the other filter output is employed in the second stage. Thus, in both stages, two complex filters having different passbands are reconstituted. By means of this filter switching procedure, two complex filters are consequently obtained from three filters of a more simple type. Broadly speaking, by adopting the same procedure in the case of all the filtering channels, n complex filters are obtained from n+1 filters of the simple type. The overall size of the circuit is thus appreciably reduced.

To set forth the invention in general terms, a novel spectrum analyzer structure is accordingly proposed and comprises a plurality of filters each provided with a low-pass output and a high-pass output both having the same cutoff frequency which is different in the case of the different filters. The analyzer structure further comprises switching means for periodically connecting pairs of filters in cascade during a first time interval between one input for signals to be analyzed and a filtered-signal transmission channel assigned to each pair of filters. A first filter of any one pair has a high-pass output (or respectively a low-pass output) which is connected to the input of a second filter whose output is constituted by the low-pass output (or respectively the high-pass output). Said switching means are also employed for periodically establishing a cascade connection during a second time interval between pairs of filters which are different from the pairs formed during the first time interval. The low-pass and high-pass outputs of a filter are employed alternately during the two time intervals.

Other features of the invention will be more apparent upon consideration of the following description and accompanying drawings, wherein:

FIG. 1 described earlier is a block diagram showing a spectrum analyzer of conventional structure;

FIG. 2 is a schematic diagram given by way of example and showing a filter of the second order as established by the method of state variables;

FIGS. 3*a* and 3*b* show the frequency response curves of a low-pass filter and of a high-pass filter having different cutoff frequencies;

A good method for splitting the frequency band to be analyzed into a number of narrow bands having high rejection outside the useful band consists for example in forming each band by means of a bandpass filter having two cutoff frequencies with a slope of +12 dB per octave below the bottom cutoff frequency $f_i$ and a slope of −12 dB per octave above the top cutoff frequency $f_{i+1}$, and with a flat portion between the two (this response curve has the shape illustrated in FIG. 4).

A bandpass filter of this type is constructed by establishing a circuit in which the Laplacian state-variable transfer function p is of the fourth order and may be written in the form:

$$S(p)/E(p) = \frac{p^2}{(Ap^2 + Bp + C)(A'p^2 + B_p' + C')} \qquad (1)$$

where:

S(p) is the filter output signal in the form of a function of the Laplacian variable, E(p) is the value of the input signal, A, B, C are coefficients which determine on the one hand the bottom cutoff frequency $f_i$ and on the other hand a damping or overvoltage coefficient of the response curve at the level of said bottom cutoff frequency, A′, B′, C′ are coefficients which determine on the one hand the top cutoff frequency $f_{i+1}$ and on the other hand a damping or overvoltage coefficient at the level of said top cutoff frequency.

The corresponding filter can be constructed by means of the state-variable method which consists in utilizing the term of highest degree $AA'p^4S(p)$ which is a fourth derivative of the output signal, in integrating said term four times in order to obtain the third, second, first derivatives and the output signal itself, and in obtaining from the outputs of each integrator and from one input signal E(p) a circuit which verifies equation (1).

Figure 3A:
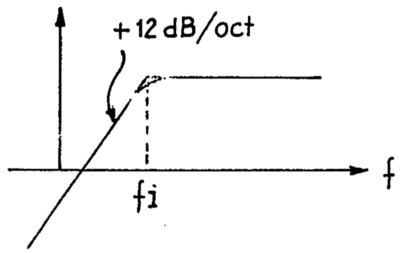
Figure 3B:
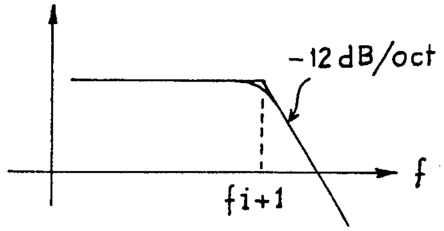

It is preferred in accordance with the invention to consider the transfer function of equation (1) as the product of the transfer functions of two filters of the second order consisting respectively of a high-pass filter having a first cutoff frequency $f_i$ and a slope of +12 dB/octave below said frequency (as shown in FIG. 3*a*), and of a low-pass filter having a higher cutoff frequency $f_{i+1}$ and a slope of −12 dB/octave above said frequency (as shown in FIG. 3*b*).

Figure 4:
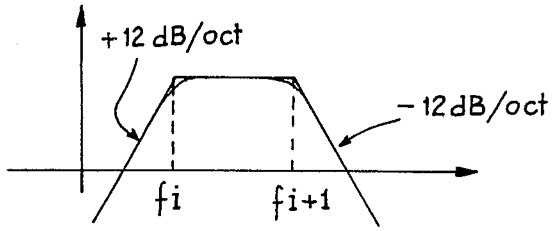
FIG. 4 shows the frequency response curve of two cascade-connected filters of the second order.

The cascade connection of these two filters produces the response curve shown in FIG. 4 and corresponding to the transfer function which is a product of the transfer functions of the two filters.

The high-pass filter will have the following transfer function:

$$F(p) = \frac{p^2}{Ap^2 + Bp + C} \qquad (2)$$

The low-pass filter will have the following transfer function:

$$F'(p) = \frac{1}{A'p^2 + B'p + C'} \qquad (3)$$

These two filters can be constructed by means of the state-variable method and it will be apparent that this accordingly results in two filters of similar design although having different parameters (especially the cutoff frequency).

Figure 2:
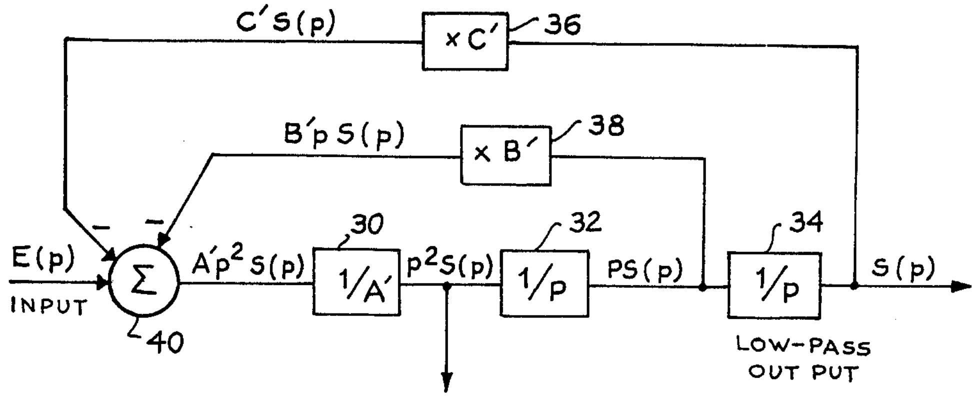

The second filter having a transfer function F′(p) is shown in FIG. 2. If equation (3) is developed by replacing F′(p) by the ratio between an output signal S(p) of the filter and an input signal E(p) which is applied to the filter, there is thus obtained:

$$A'p^2S(p) + B'pS(p) + C'S(p) = E(p)$$

or alternatively:

$$A'p^2S(p) = E(p) - (B'pS(p) + C'S(p)) \qquad (4)$$

Equation (4) is immediately represented in the form of a circuit (as shown in FIG. 2). It should be noted at the same time that, starting from a postulated signal $A'p^2S(p)$, this signal can be divided by A′ (attenuator 30), then integrated in order to obtain a signal pS(p) (integrator 32), and again integrated in order to obtain a signal S(p) (integrator 34) which will represent the output of the filter. In addition, the signal S(p) is multiplied by a coefficient C′ (amplifier 36), and pS(p) is multiplied by a coefficient B′ (amplifier 38), with the result that the signals C′S(p) and B′pS(p) are therefore obtained. A signal E(p) which will be the input signal of the filter is introduced into an arithmetical summing device 40 and the signals B′pS(p) and C′S(p) are subtracted. The output of the summing device therefore delivers a signal E(p)–B′pS(p)–C′S(p).

It is only necessary to connect the aforesaid output of the summing device 40 to the input of the attenuator 30 in order to ensure that equation (4) is satisfied. The result thereby achieved is a low-pass filter of the second order having the following transfer function:

$$F'(p) = \frac{1}{A'p^2 + B'p + C'} \qquad (3)$$

It should be pointed out, however, that the output of the attenuator 30 can be employed as a filter output instead of the output of the second integrator 34.

In point of fact, this output delivers a signal which is $p^2S(p)$ and which is therefore:

$$\frac{p^2E(p)}{A'p^2 + B'p + C'}$$

which is precisely a transfer function of a high-pass filter of the second order.

There has therefore been formed either a low-pass filter or a high-pass filter of the second order, depending on whether the low-pass output (output of the second integrator 34) or the high-pass output (after the attenuator 30) is employed. The cutoff frequency is the same in both cases and is defined by the polynomial $A'p^2+B'p+C'$.

On this conceptual basis, it is proposed in accordance with the invention to adopt a single filter of the second order and to use this latter first as a low-pass filter associated in cascade with a high-pass filter having a lower cutoff frequency, then as a high-pass filter associated in cascade with a low-pass filter having a higher cutoff frequency. If the cutoff frequency of the filter under consideration is the same in both cases, there will thus be provided successively two bandpass filters of the fourth order having adjacent frequency bands with only three filters of the second order. Similarly, if provision is made for a whole series of n filters of the fourth order, they can be replaced by n+1 filters of the second order.

Figure 5:
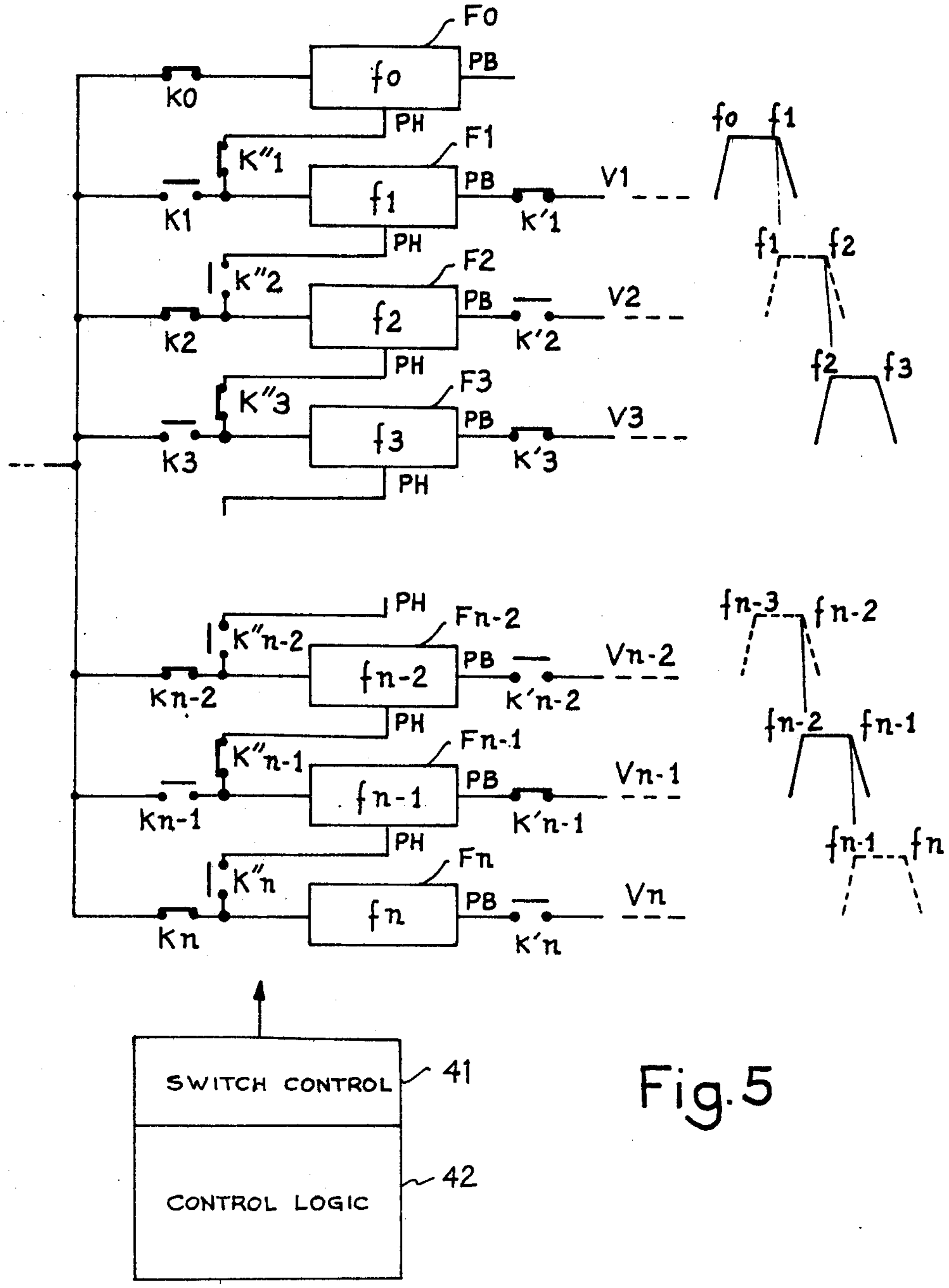
FIG. 5 is a schematic diagram showing the arrangement of the filtering channels of a spectrum analyzer according to the invention.

FIG. 5 shows the arrangement of a spectrum analyzer which makes it possible to achieve this economy. It may already be stated at the present juncture, however, that the aforesaid example of a filter of the fourth order split-up into two filters of the second order can be generalized whilst the method remains the same: a filter of the sixth order can be split-up into two filters of the third order and even a filter of the fifth order can be split-up into a filter of the second order and a filter of the third order although there is a modification in the last-mentioned case inasmuch as two filters of the fifth order with adjacent frequency bands which will be produced by employing the same filter will not have identical response-curve shapes by reason of the fact that there will be a slope of 18 dB/octave at low frequency and 12 dB/octave at high frequency in one case and the reverse in the other case.

Figure 1:
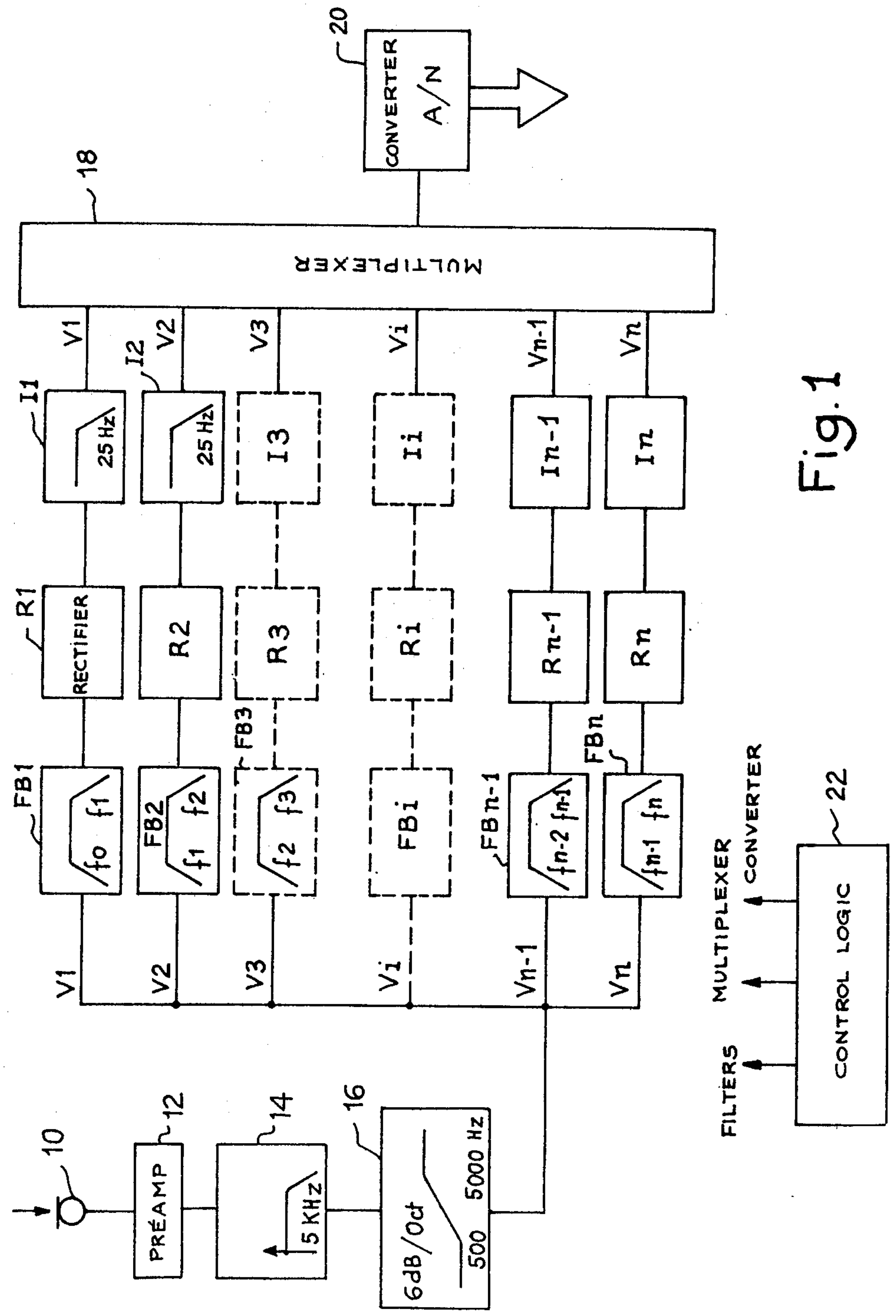

FIG. 5 shows only the arrangement of the filters in the filtering channels V1 to Vn. It will be apparent that each channel is provided as in FIG. 1 with a thresholdless rectifier and with an averaging integrator (not shown in the drawings) and that, after the averaging integrators, the different channels are connected to a multiplexing circuit which is controlled in such a manner as to carry out a cyclic sampling operation in each channel with an overall period of approximately twenty milliseconds.

In a first stage of the twenty-millisecond period, only one-half of the channels (for example, the odd-numbered channels) transmits a useful signal and the multiplexing circuit is so arranged as to take samples only in these channels. In a second time interval, the other half (odd-numbered channels) transmits useful signals and the multiplexing circuit takes samples from these other channels.

Switching means are provided in each channel with suitable control means for ensuring that the different filters employed can serve alternately in an odd-numbered channel and in an even-numbered channel, depending on whether the first stage or the second stage of the multiplexing cycle is being considered.

Provision is made for a number n+1 of filters $F_o$ to $F_n$ in respect of n channels and each filter has a principal cutoff frequency $f_o$ to $f_n$ with an attenuation of, for example, 12 dB per octave (second order) and with a low-pass output (PB) and a high-pass output (PH).

The input signal to be analyzed is applied to the inputs of the filters via switches Ko to Kn (consisting of MOS transistors, for example). The even-numbered switches are closed during the first stage of the multiplexing cycle and open during the second stage.

Other switches K'1 to K'n are connected downstream of the low-pass outputs of the various filters (except for the first filter) in order to connect said outputs to the other elements of the channels V1 to Vn. The switches K'1 to K'n are closed and opened in phase opposition with respect to the switches K1 to Km.

Again a number of other switches K"1 to K"n are connected between the high-pass output of a filter (Fo to Fn-1) and the input of the following filter (F1 to Fn). These switches are closed and opened in phase with the switches K'1 to K'n.

A switching control circuit 41 produces action on the switches in synchronism with the control of the multiplexing circuit. Said switching control circuit forms part of a control logic which is provided in addition with the functions mentioned with reference to FIG. 1, namely control of multiplexing, of the analog-to-digital converter which can be placed at the output of the multiplexing circuit, and of switching of the integration capacitors if the filters are switched-capacitance filters.

Thus in the first stage of each multiplexing cycle, the signal to be analyzed is applied to the input of the filter Fo and a signal which has been filtered by the cascade-connected filters F0 and F1 is applied to the high-pass output of said filter Fo, said output being connected to the input of the filter F1, the low-pass output of which transmits said filtered signal on the channel V1 via the closed switch K'1. The frequencies within the narrow band $f_o$, $f_1$ are therefore transmitted on channel 1.

Similarly, in the case of all the even-numbered filters, the low-pass output of each filter is isolated from the channel which has the same rank and which therefore does not transmit any signal. However, the signal to be analyzed is applied to the input of each filter and the high-pass output of this latter is connected to the input of the odd-numbered filter of immediately higher rank; this latter is isolated from the signal to be analyzed and its low-pass output is connected to the corresponding odd-numbered channel.

On the contrary, in the second stage of the multiplexing cycle, all the switches are reversed and if consideration is again given to an even-numbered filter, this filter becomes isolated from the signal to be analyzed but cascade-connected to the high-pass output of the preceding odd-numbered filter to which the signal to be analyzed is applied.

In the first stage, the frequencies within the bands $f_o,f_1/f_2,f_3/\ \ldots\ /f_{n-1},f_n$ are therefore transmitted whereas, in the second stage, the frequencies of the adjacent intercalary bands $f_1,f_2/f_3,f_4/\ldots/f_{n-2},f_{n-1}$ are transmitted.

In each stage of the cycle, it is an advantage to ensure that the multiplexing circuit takes samples first from the higher-frequency channels, then from the lower-frequency channels. Thus the outputs of the filters and of the integrators which follow these latter in each channel are given more time to be established at their new value (the lowest frequencies are established more slowly).

In the example under consideration, the filters have been connected in series in the following order: high-pass output of one filter connected to the input of a filter having a higher cutoff frequency. Arrangements could also be made to ensure that the low-pass output of one filter is connected to the input of a filter having a lower cutoff frequency.

Figure 6:
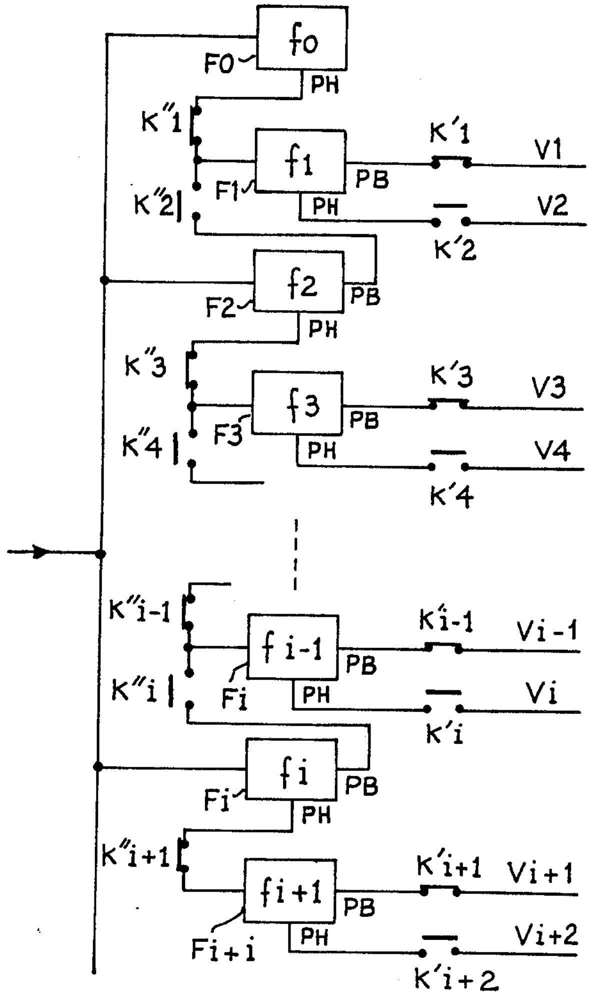
FIG. 6 shows an alternative arrangement according to the invention.

In an alternative form of construction, a combination of these two solutions can also be provided as shown in FIG. 6. In this variant, the input of one filter out of two (Fi) is continuously connected to the input for the signal to be analyzed. The low-pass output of said filter is connected via a switch K"i (i=1 to n) to the input of the filter (Fi−1) of lower cutoff frequency which precedes the filter under consideration whereas the high-pass output of this latter is connected, via another switch K"i+1 which operates in phase opposition with respect to the first switch, to the input of the following filter (Fi+1). The low-pass and high-pass outputs of the filter Fi−1 preceding the filter under consideration are connected respectively to two different transmission channels Vi−1 and Vi which each comprise a thresholdless rectifier and an integrator (not shown in the drawings) as in the case of FIG. 5 or of FIG. 1. The low-pass and high-pass outputs of the filter (Fi+1) according to the filter considered are connected respectively to the two following channels Vi+1 and Vi+2. Switches K'i which operate in phase opposition can be provided between the outputs of a filter and the corresponding channels.

The switch K'i will be closed when the switch K"i is closed.

In FIG. 6, the input of each even-numbered filter is continuously connected to the input of the signal to be analyzed whilst the low-pass and high-pass outputs of the odd-numbered filters are connected via switches K'i and K'i+1 to the respective channels Vi and Vi+1.

This arrangement offers the advantage of dispensing with the switches which had been necessary in FIG. 5 between the input for the signal to be analyzed and the filter inputs.

In FIG. 5 as in FIG. 6, consideration can be given to the possibility of dispensing with one transmission channel out of two by virtue of the fact that the output switches upstream of the transmission channels operate in phase opposition and also by virtue of the fact that the rectifiers and integrators of the transmission channels in any case operate usefully only during one stage out of two in each multiplexing cycle. A single transmission channel Vi can therefore be connected to the outputs of two switches Ki' and Ki'+1, thus achieving a substantial economy of circuit space. The transmission channel Vi then transmits alternately during the two stages of the multiplexing cycle a signal which is filtered within the frequency band $f_{i-1},f_i$ and a signal which is filtered within the band $f_i,f_{i+1}$.

The multiplexing operation is therefore carried out by taking two different samples from each channel respectively in one case during the first stage of the cycle and in the other case during the second stage.

Figure 7:
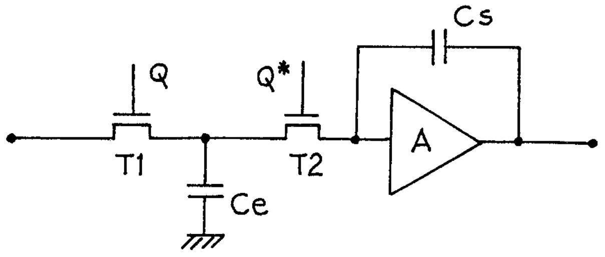
FIG. 7 shows one example of a possible mode of construction of the filter integrators by means of an operational amplifier and switched capacitors.

The filters are preferably constructed in the form of switched-capacitance filters or in other words filters in which each integrator consists of an operational amplifier A closed on a loop with a negative-feedback capacitor Cs but which, instead of having an input resistor Re in series (which would define an integration time constant ReCs with the capacitor Cs) is provided with an input circuit consisting of an input capacitor Ce in parallel. Said capacitor can be isolated either from the signal input of the integrator or from the input of the amplifier A by means of two switches. Said switches preferably consist of two MOS transistors T1 and T2 which operate under the control of complementary signals Q and Q* or at least under the control of signals such that both switches are never closed at the same time. It is apparent that a circuit arrangement of this type as shown in FIG. 7 is equivalent to an integrator having an input resistance equal to $1/C_ef_e$ if $f_e$ is the switching frequency of the capacitor Ce, that is, the frequency of the signals Q and Q* which ensure the transfer of charges from the signal input to the capacitor Ce, then from the capacitor Ce to the capacitor Cs.

Two points are more particularly worthy of note:

In the first place, the operational amplifiers are really in service only during the very short time interval required for transfer of charges from the capacitor Ce to the capacitor Cs. Provision can therefore be made for an arrangement such that a plurality of integrators of one filter or of a number of filters are provided with only one operational amplifier which is connected by multiplexing in a number of different pairs of capacitors Ce, Cs.

Furthermore, it is pointed out that the integration time constant is inversely proportional to the switching frequency $f_e$. The cutoff frequencies of the filters of the spectrum analyzer can therefore be modified by producing action on the frequency $f_E$. For example, it may be found desirable to split the spectrum of analyzed frequencies into narrow bands which are not entirely adjacent. In other words, two bandpass filters corresponding to successive bands do not have a common cutoff frequency which is the top cutoff frequency of one filter and the bottom cutoff frequency of the other filter. In this case, the invention will nevertheless remain applicable if the cutoff frequencies are modified by producing action on the frequency of switching of the capacitors Ce between the first stage and the second stage of the multiplexing cycle: a cutoff frequency which is $f_i$ in a first stage would become $f'_i$ in a second stage and, instead of splitting a spectrum into narrow cutoff frequency bands $f_{i-1},f_i$ and $f_i,f_{i+1}$ which are in strictly adjacent relation, said spectrum would be split into two narrow bands $f_{i-1},f_1$ and $f'_i,f'_{i+1}$. It may be noted that the same result would be achieved by modifying the value of a capacitance Ce or Cs between the two stages of the multiplexing cycle (for example by switching capacitors in parallel) since the integration time constants are of the form Cs/Cefe.

What is claimed is:

1. A spectrum analyzer, wherein said analyzer comprises a plurality of filters each provided with a low-pass output and a high-pass output both having the same cutoff frequency which is different in the case of the different filters, and switching means for periodically connecting pairs of filters in cascade during a first time interval between one input for signals to be analyzed and a transmission channel assigned to each pair of filters, the high-pass (or respectively low-pass) output of one of the filters being connected to the input of a second filter in which the utilized output is the low-pass (or respectively high-pass) output and for periodically establishing a cascade connection during another time interval between pairs of filters which are different from the first pairs, the output utilized in the case of a filter during the second time interval being different from the output utilized during the first time interval.

2. A spectrum analyzer according to claim 1 wherein, during the second time interval, the high-pass (or respectively low-pass) output of the first filter aforesaid is isolated from the input of the second filter aforesaid, wherein the input of said second filter is connected to the input for signals to be analyzed, wherein the utilized output of said second filter is the high-pass (or respectively low-pass) output and wherein said output is connected to the input of another filter having a higher (or respectively lower) cutoff frequency than that of said second filter.

3. A spectrum analyzer according to claim 2, wherein switches operating in phase opposition during the first and second time intervals are connected between the low-pass (or respectively high-pass) outputs of two adjacent filters and the corresponding transmission channels.

4. A spectrum analyzer according to claim 3, wherein switches connected to the low-pass (or respectively high-pass) outputs of two adjacent filters are connected to a common transmission channel in order to connect either of the adjacent filters to said channel in alternate sequence during the first and second time intervals.

5. A spectrum analyzer according to claim 1, wherein the input of one filter out of two is connected to the input for signals to be analyzed, the high-pass output of the filter aforesaid being connected during the first time interval to another filter having a higher cutoff frequency and the low-pass output of the filter aforesaid being connected during the second time interval to another filter having a lower cutoff frequency, and wherein the low-pass and high-pass outputs of said two other filters are connected to filtered-signal transmission channels.

6. A spectrum analyzer according to claim 5, wherein switches connected to the two outputs of a filter which is not connected to the signal input are connected to a common transmission channel in order to connect either of the two outputs of said filter to said channel in alternate sequence during the first and second time intervals.

7. A spectrum analyzer according to claim 1, wherein the filters are switched-capacitance filters having cutoff frequencies which can be modified by variation of a sampling frequency or of values of capacitances between the first and the second time intervals.

* * * * *